United States Patent [19]
Ozawa

[11] Patent Number: 5,471,366

[45] Date of Patent: Nov. 28, 1995

[54] MULTI-CHIP MODULE HAVING AN IMPROVED HEAT DISSIPATION EFFICIENCY

[75] Inventor: Takashi Ozawa, Kawasaki, Japan

[73] Assignee: Fujitsu Limited, Kawasaki, Japan

[21] Appl. No.: 281,672

[22] Filed: Jul. 28, 1994

[30] Foreign Application Priority Data

Aug. 19, 1993 [JP] Japan ..................... 5-205444

[51] Int. Cl.⁶ ..................................... H05K 7/20
[52] U.S. Cl. .................. 361/704; 174/52.4; 257/724; 361/719; 361/792
[58] Field of Search .................. 174/16.3, 52.2, 174/52.4, 252, 260; 165/80.3, 185; 257/706, 707, 712, 713, 723, 724; 361/690, 704, 705, 717–719, 722, 783, 768, 784, 792, 795

[56] References Cited

U.S. PATENT DOCUMENTS

| | | | |
|---|---|---|---|
| 4,729,061 | 3/1988 | Brown | 361/386 |
| 5,065,280 | 11/1991 | Karnezos | 361/386 |
| 5,172,213 | 12/1992 | Zimmerman | 257/796 |
| 5,173,844 | 12/1992 | Adachi | 361/414 |

FOREIGN PATENT DOCUMENTS

| | | |
|---|---|---|
| 4-168753 | 6/1992 | Japan . |
| 5-82672 | 4/1993 | Japan . |
| 5-90318 | 4/1993 | Japan . |

Primary Examiner—Gerald P. Tolin
Attorney, Agent, or Firm—Armstrong, Westerman, Hattori, McLeland & Naughton

[57] ABSTRACT

A multi-chip module includes a substrate, an interconnection pattern provided on the substrate, a plurality of semiconductor chips provided commonly upon the substrate in electrical connection with the interconnection pattern, a plurality of thermally conductive blocks each provided on corresponding one of the plurality of semiconductor chips in an intimate contact therewith, a resin package body that encapsulates the plurality of semiconductor chips and the plurality of thermally conductive blocks together with the substrate, such that the resin package body has an upper major surface substantially flush with the upper major surfaces of the plurality of thermally conductive blocks, and a heat sink mounted upon the upper major surface of the resin package body such that the heat sink establishes an intimate contact with respective upper major surfaces of the thermally conducting blocks.

5 Claims, 11 Drawing Sheets

MULTI-CHIP MODULE HAVING AN IMPROVED HEAT DISSIPATION EFFICIENCY

BACKGROUND OF THE INVENTION

The present invention generally relates to multi-chip modules including a plurality of semiconductor chips mounted on a common substrate, and more particularly to a multi-chip module having an improved heat dissipation efficiency.

In order to meet the demand for increased processing speed, recent computers use multi-chip modules in which a plurality of semiconductor chips are mounted on a common substrate that carries thereon a multilayer interconnection structure. Such a multi-chip module is then mounted on a printed circuit board that may be a mother board of a computer.

In such a construction of multi-chip modules, there arises a problem of increased heating due to the mounting of plural semiconductor chips on a common substrate, wherein each of the semiconductor chips causes an increased heating associated with increased integration density and hence increased power consumption. Thus, it is essential to provide a heat dissipation structure for efficient heat dissipation when designing a multi-chip module.

FIG. 1 shows the construction of a conventional multi-chip module 10.

Referring to FIG. 1, the multi-chip module 10 includes an interconnection substrate 11, wherein the interconnection substrate 11 has a lower major surface on which a multilayer interconnection structure 11a is provided, and semiconductor chips $12_{-1}$ and $12_{-2}$ are mounted upon the interconnection structure 11a. Each of the semiconductor chips $12_{-1}$ and $12_{-2}$ carries thereon a number of bonding pads (not shown) connected to respective patterns included in the multilayer interconnection structure 11a by way of bonding wires, and interconnection patterns in the multilayer interconnection structure 11a are connected to respective interconnection leads 14. Further, the semiconductor chips $12_{-1}$ and $12_{-2}$ are encapsulated upon the interconnection structure 11a by a resin package body 13, together with the bonding wires and the interconnection leads 14. Further, the multi-chip module 10 includes a fin-shaped heat sink 15 on the upper major surface of the interconnection substrate 11, and the multi-chip module 10 is mounted upon a mother board 16.

In FIG. 1, it will be noted that the interconnection structure 11a includes thermal via holes 17 provided in correspondence to the region in which the semiconductor chips are mounted for heat dissipation. Thus, the heat in the semiconductor chips $12_{-1}$ and $12_{-2}$ is conducted from the chip to the substrate 11 along the thermal via holes 17 and reaches the heat sink 15 as indicated by arrows 18, wherein the heat sink 15 radiates the heat thus conducted thereto into the environment.

In such a structure of the multi-chip module, the efficiency of heat radiation from the heat sink 15 is restricted by the thermal resistance of the thermal via holes 17 as well as by the thermal resistance of the substrate 11, wherein the contribution of thermal resistance of the thermal via holes 17 is particularly important in view of the fact that one cannot increase the diameter or number of the thermal via holes 17 arbitrarily according to the needs because of the constraint of pattern density of the interconnection patterns in the interconnection structure 11a. In other words, there exists a limit in the reduction of thermal resistance of the thermal via holes 17. Because of this, the conventional multi-chip module 10 of FIG. 1 has suffered from the problem of relatively large thermal resistance. Associated with the problem of large thermal resistance, the conventional multi-chip module also has a problem in that one cannot mount high power semiconductor chips on such a multi-chip module.

SUMMARY OF THE INVENTION

Accordingly, it is a general object of the present invention to provide a novel and useful multi-chip module and a fabrication process thereof, wherein the foregoing problems are eliminated.

Another and more specific object of the present invention is to provide a multi-chip module and a fabrication process thereof having a substantially reduced thermal resistance and a substantially improved heat radiation.

Another object of the present invention is to provide a multi-chip module comprising:

a substrate having upper and lower major surfaces;

an interconnection pattern provided on said upper major surface of said substrate;

a plurality of semiconductor chips provided commonly upon said upper major surface of said substrate in electrical connection with said interconnection pattern;

a plurality of thermally conductive blocks each provided on corresponding one of said plurality of semiconductor chips in an intimate contact therewith;

a resin package body that encapsulates therein said plurality of semiconductor chips and said plurality of thermally conductive blocks together with said substrate;

said plurality of thermally conductive blocks having respective upper major surfaces at a level such that said upper major surfaces of said thermally conductive blocks form a substantially flush, planar surface with an upper major surface of said resin package body, said upper major surfaces of said thermally conductive blocks being thereby exposed at said upper major surface of said resin package body;

a plurality of leads projecting from said resin package body, each of said plurality of leads being connected electrically to said interconnection pattern on said substrate; and a heat sink mounted upon said upper major surface of said resin package body such that said heat sink establishes an intimate contact with respective upper major surfaces of said thermally conducting blocks. According to the present invention, the heat in the semiconductor chips are efficiently dissipated from the heat sink that establishes an intimate contact with the upper major surfaces of the thermally conducting blocks, by way of radiation.

In a preferred embodiment of the present invention, said resin package body covers both said upper and lower major surfaces of said substrate. According to the present invention, it is possible to achieve efficient heat dissipation for the resin package body formed by a transfer molding process.

In another preferred embodiment of the present invention, said resin package body is provided on said upper major surface of said substrate. According to the present invention, it is possible to achieve efficient heat dissipation for the resin package body formed by a potting process.

In another preferred embodiment of the present invention, said heat sink is mounted upon said upper major surface of said resin package body by way of a silicone adhesive. By using silicone adhesive that shows a resiliency, it is possible to absorb any mechanical stress developing at the interface between the heat sink and the resin package body due to the difference in the thermal expansion. Thereby, the problem of degradation of thermal resistance caused by the cracking at the interface is substantially and successfully eliminated.

In another preferred embodiment of the present invention, said multi-chip module include a solder layer, in correspondence to each of said semiconductor chips, such that said solder layer is interposed between an upper major surface of said semiconductor chip and said thermally conducting block thereon. By providing such a solder layer, it is possible to compensate for any variation in the level of the upper major surface of the thermally conducting blocks, and an intimate contact between the thermally conducting blocks and the heat sink thereon is guaranteed.

Another object of the present invention is to provide a process for fabricating a multi-chip module, comprising the steps of:

mounting a plurality of semiconductor chips on a semiconductor substrate that carries thereon an interconnection pattern;

bonding a plurality of thermally conductive blocks on an upper major surface of said semiconductor chips;

forming a resin package body by covering said plurality of semiconductor chips on said substrate and said thermally conductive blocks on said semiconductor chips, by a molten resin;

polishing an upper major surface of said resin package body to form a substantially flat upper major surface for said resin package body, such that said thermally conductive blocks are exposed at said substantially flat upper major surface, with respective upper major surfaces forming a substantially flush surface with said flat upper major surface of said resin package body; and mounting a heat sink such that said heat sink establishes an intimate contact with respective exposed upper major surfaces of said thermally conductive blocks. According to the present invention, it is possible to form the thermally conductive blocks to have substantially flush upper major surfaces, and an intimate contact is easily achieved between the plural thermally conductive blocks and the heat sink. Thereby, the efficiency of heat dissipation is substantially improved.

In a preferred embodiment of the present invention, said step of forming the resin package body includes a step of molding said molten resin in a mold in a state such that said substrate, said semiconductor chips and said thermally conductive blocks are held in said mold.

In a preferred embodiment of the present invention, said step of forming the resin package body includes a step of potting conducted such that a molten resin is poured on said upper major surface of said substrate.

Other objects and further features will become apparent from the following detailed description when read in conjunction with the attached drawings.

DETAILED DESCRIPTION OF PREFERRED EMBODIMENTS

Figure 1:
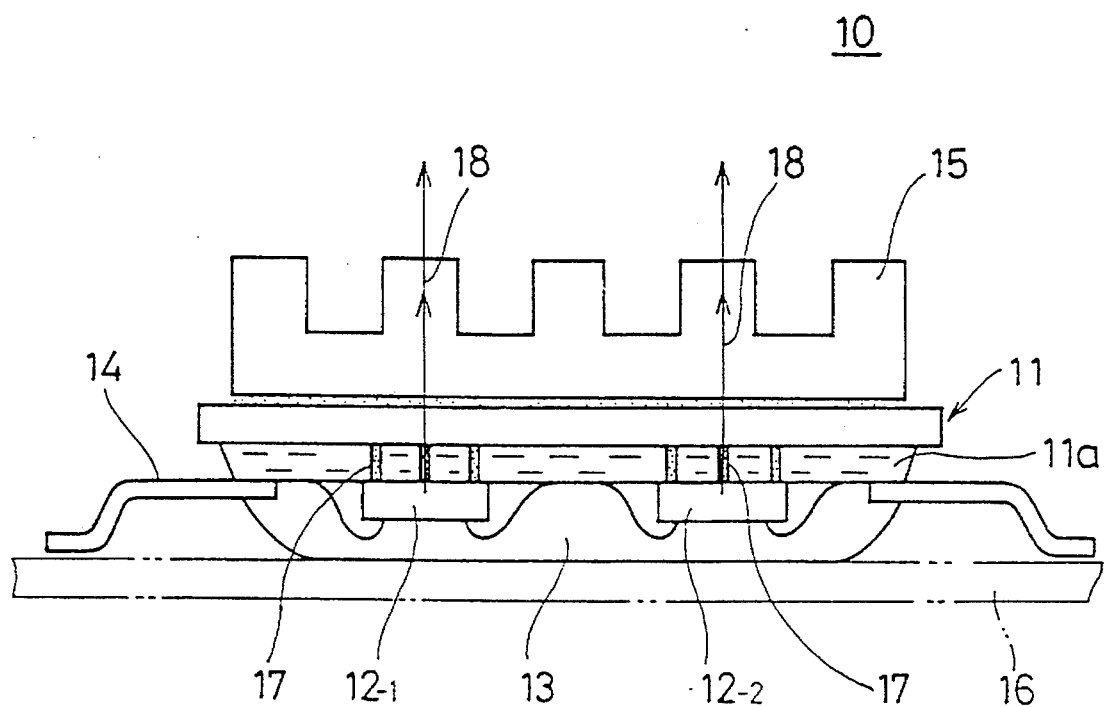
FIG. 1 is a diagram showing the structure of a conventional multi-chip module in a cross sectional view.
Figure 2:
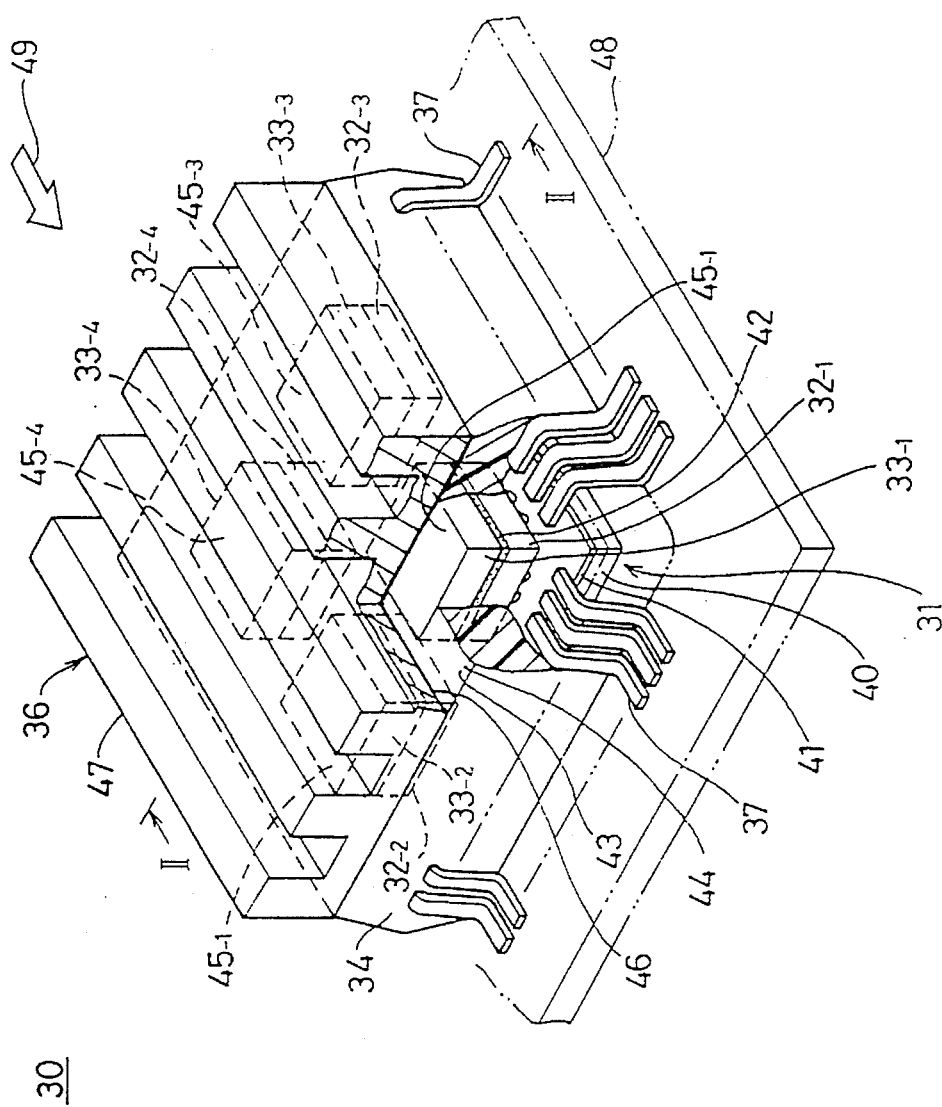
FIG. 2 is a diagram showing a multi-chip module according to a first embodiment of the present invention in a perspective view.
Figure 3:
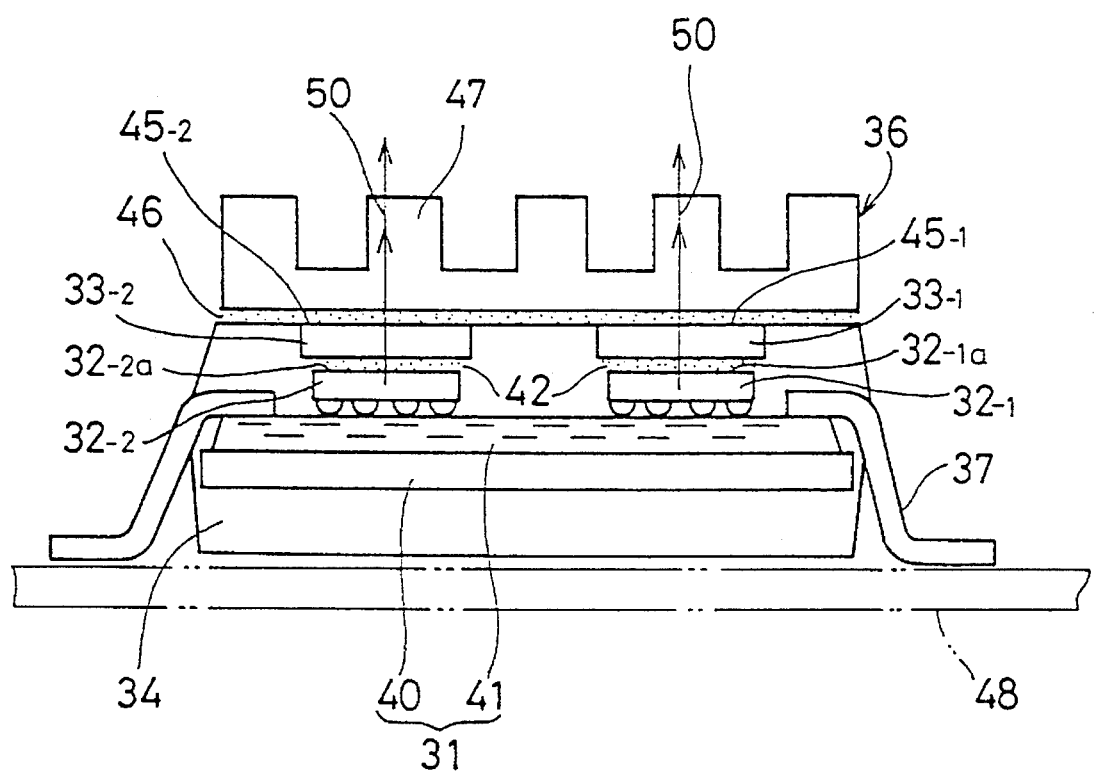
FIG. 3 is a diagram showing the multi-chip module of FIG. 2 in a cross sectional view.

FIGS. 2 and 3 show a multi-chip module 30 according to a first embodiment of the present invention, wherein FIG. 2 shows the multi-chip module 30 in a perspective view while FIG. 3 shows the same module 30 in a cross sectional view taken along a line II—II in FIG. 2.

Referring to FIGS. 2 and 3, the multi-chip module 30 includes a multilayer interconnection substrate 31 carrying thereon semiconductor chips $32_{-1}$–$32_{-4}$, wherein the semiconductor chips $32_{-1}$–$32_{-4}$ carry respective thermally conductive blocks $33_{-1}$–$33_{-4}$ and are embedded in a resin package body 34 together with the blocks $33_{-1}$–$33_{-4}$. The resin package body 34, in turn, carries thereon a single heat sink block 36, and a number of interconnection leads 37 project from the resin package body 34.

The multilayer interconnection substrate 31, in turn, is formed of a substrate 40 of a glass or a ceramic and carries a multilayer interconnection structure 41 on an upper major surface thereof. Thus, the semiconductor chips $32_{-1}$–$32_{-4}$ are mounted upon the upper major surface of the substrate 40 by a flip-chip process such that interconnection pads on the semiconductor chips are connected electrically to corresponding terminal pads on the interconnection structure 41. Typically, the interconnection structure 41 includes a plurality of interconnection patterns stacked one after another.

The thermally conductive blocks $33_{-1}$–$33_{-4}$, collectively designated by a numeral 33, are formed of a metal block of aluminum and have a size generally equal to the size of the semiconductor chips. The thermally conductive blocks 33 are thereby mounted upon upper major surfaces $32_{-1a}$, $32_{-2a}$, ... of the corresponding semiconductor chip $32_{-1}$–$32_{-4}$ by means of a thermally conductive adhesive such as a silver paste 42.

The multilayer interconnection substrate 31 further carries thereon the leads 37 projecting outward from the periphery of the substrate 31, wherein the leads 37 are mounted on the upper major surface of the substrate 31 in electrical connection with the conductive patterns formed on the substrate 31. Further, the resin package body 34, typically formed by a transfer molding process, encloses the entirely of the interconnection substrate 31 together with the semiconductor chips $32_{-1}$–$32_{-4}$ as well as the thermally conductive blocks $33_{-1}$–$33_{-4}$, such that the interconnection leads 37 project outward from the resin package body 37. It should be noted that the resin package body 34 has an upper major surface 43, which in turn includes a polished resin surface 44 and polished upper major surfaces $45_{-1}$–$45_{-4}$ of the thermally conductive blocks $33_{-1}$–$33_{-4}$, wherein the surface 44 and the surfaces $45_{-1}$–$45_{-4}$ define together a substantially flush, planar surface on which the heat sink block 36 is mounted with an intimate contact.

It should be noted that the heat sink block has a size and shape substantially identical with the resin package body 34 in the plan view and is mounted upon the foregoing upper major surface 43 by means of a silicone adhesive layer 46. Thereby, the heat sink block 36 establishes an intimate contact with each of the polished upper major surfaces $45_{-1}$–$45_{-4}$ of the thermally conductive blocks $33_{-1}$–$33_{-4}$ and effectively absorbs the heat generated in the semiconductor chips $32_{-1}$–$32_{-4}$ via the thermally conductive blocks $33_{-1}$–$33_{-4}$. The heat sink block 36 carries a plurality of heat radiation fins 47 on the upper major surface thereof for radiation of the heat thus absorbed into the environment. For efficient heat dissipation, the heat radiation fins 47 are aligned parallel with each other for facilitating the flow of cooling air 49.

The multi-chip module 30 having the construction described above is mounted upon a mother board 48 of an electronic apparatus such as a computer by soldering the leads 37 upon corresponding wiring patterns provided on the upper major surface of the mother board 48.

In the multi-chip module 30, it should be noted that the heat generated in the semiconductor chips such as the semiconductor chip $32_{-1}$ is dissipated along a path 50 indicated in FIG. 3 by an arrow. More specifically, the heat in the chip $32_{-1}$ is conducted to the thermally conductive block $33_{-1}$ via the back surface $32_{-1a}$ of the chip, and is further conducted to the heat sink block 36. The heat thus conducted is further radiated to the air from the cooling fins 47 that is cooled by the cooling air.

In order to facilitate the foregoing heat dissipation, it is preferable to form the thermally conductive blocks $33_{-1}$–$33_{-4}$ from a material having a small thermal resistance such as aluminum. Further, the thermally conductive blocks $33_{-1}$–$33_{-4}$ achieve an intimate contact with the corresponding upper major surface of the semiconductor chips $32_{-1}$–$32_{-4}$, such that there is no void or pore formed in the silver paste 42. As a result, the thermal resistance between the semiconductor chips and the corresponding thermally conductive blocks is held minimum. A similar intimate contact is achieved also at the interface between the heat sink block 36 and the polished upper major surface of the thermally conductive blocks $33_{-1}$–$33_{-4}$. Thus, there is no substantial void or pore formed in the silicone adhesive layer 46 connecting the thermally conductive blocks $33_{-1}$–$33_{-4}$ and the heat sink block 36, and the thermal resistance between the thermally conductive blocks and the heat sink block is held minimum. As already noted, the upper major surfaces $32_{-1a}$, $32_{-2a}$, ... of the thermally conductive blocks $33_{-1}$–$33_{-4}$ form a substantially flush surface, and the heat sink block 36 establish the foregoing intimate contact with all of the thermally conductive blocks $33_{-1}$–$33_{-4}$.

It will be noted that, because of the high efficiency of heat dissipation, one can use high power integrated circuits having a large integration density for such a multi-chip module 30. Further, the use of silicone adhesive provides a desirable resiliency to the adhesive layer 46 such that any thermal stress caused by the difference in the thermal expansion between the resin package body 34 and the heat sink block 36 is effectively absorbed by the resilient adhesive layer 46. Thereby, the problem of degradation of the thermal resistance at the interface between the package body 34 and the head sink block 36, due to the cracking in the adhesive layer 46, is effectively eliminated. It should be noted that it is possible to optimize the thermal expansion of the substrate 40 by using a glass substrate and optimizing the composition thereof, such that the thermal expansion of the substrate 40 is close to the thermal expansion of the resin package body 34. In such a case, one can increase the size of the multi-chip module 30.

Next, the fabrication process of the multi-chip module 30 will be described with reference to FIG. 4 as well as with reference to FIGS. 5A–5F. In FIGS. 5A–5F, it will be noted that only the semiconductor chips $32_{-1}$ and $32_{-2}$ and corresponding thermally conductive blocks $33_{-1}$ and $33_{-2}$ are illustrated, while this is merely for the sake of simplicity of illustration. It is intended that the same processes are applied also to the semiconductor chips $32_{-3}$ and $32_{-4}$ as well as to the corresponding thermally conductive blocks $33_{-3}$ and $33_{-4}$.

Figure 4:
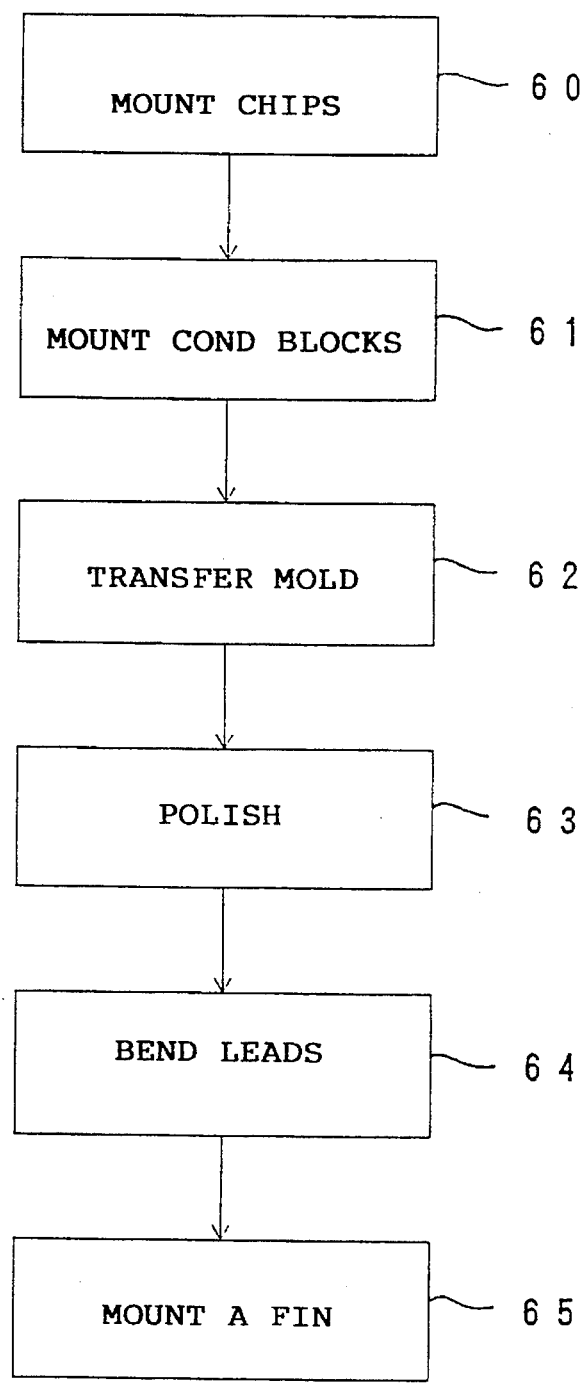
FIG. 4 is a flowchart showing the fabrication process of the multi-chip module of FIG. 2.
Figure 5A:
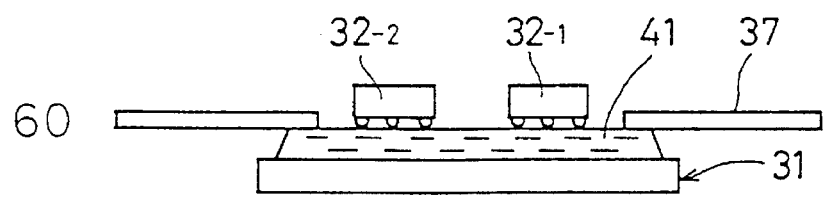
FIGS. 5A–5F are diagrams showing the fabrication process of the multi-chip module of FIG. 2 in correspondence to the flowchart of FIG. 4.

Referring to FIG. 4, a step 60 is conducted first in which the semiconductor chips $32_{-1}$–$32_{-4}$ are mounted upon the multilayer interconnection structure 41 of the interconnection substrate 31 that already carries the leads 37 thereon, by a flip chip process as indicated in FIG. 5A.

Figure 5B:
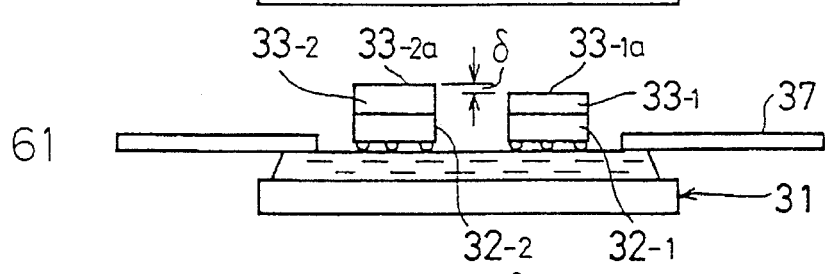

Next, in a step 61 of FIG. 4, a silver paste is applied on the upper major surfaces of the semiconductor chips $32_{-1}$–$32_{-4}$ and the thermally conductive blocks $33_{-1}$–$33_{-4}$ are mounted upon the corresponding chips $32_{-1}$–$32_{-4}$ by way of the silver paste as indicated in FIG. 5B. In this step, it is preferable to process the surface of the thermally conductive blocks $33_{-1}$–$33_{-4}$ to form a rough surface for better adherence between the thermally conducting blocks $33_{-1}$–$33_{-4}$ and the resin package body 34.

In the state of FIG. 5B, there may be a difference 6 in the level of the upper major surfaces $33_{-1a}$, $33_{-2a}$, ... of the thermally conductive blocks $33_{-1}$–$33_{-4}$ associated with the variation in the thickness of the thermally conductive blocks $33_{-1}$–$33_{-1}$ or due to the difference in the state of mounting of the semiconductor chips $32_{-1}$–$32_{-4}$ on the multilayer interconnection structure 41 on the substrate 31. Thus, it is not expected that the heat sink block 36 mounted directly upon the thermally conductive blocks $33_{-1}$–$33_{-4}$ in the state of FIG. 5B achieves the desired intimate contact and hence low thermal resistivity with the thermally conductive blocks $33_{-1}$–$33_{-4}$.

Figure 5C:
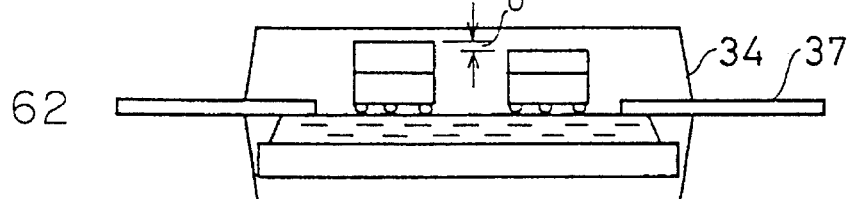

In the present embodiment, therefore, the structure of FIG. 5B is subjected to a transfer molding process in a step 62 of FIG. 4, in which the resin package body 34 is formed such that the package body 34 encloses the substrate 31 as well as the semiconductor chips $32_{-1}$–$32_{-4}$ and the thermally conductive blocks $33_{-1}$–$33_{-4}$ provided thereon as indicated in FIG. 5C.

Figure 5D:
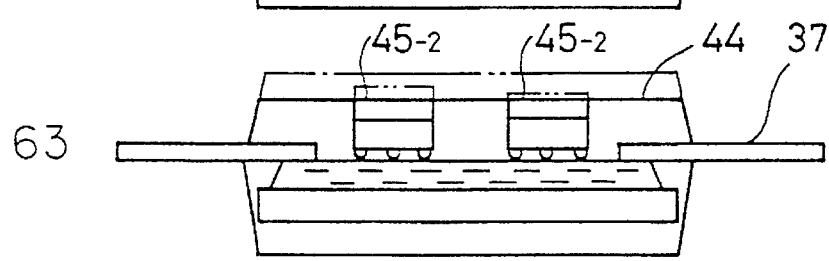

After the step 62, the upper major surface of the resin package body 34 is polished in a step 63 of FIG. 4, until all of the thermally conductive blocks $33_{-1}$–$33_{-4}$ are exposed as indicated in FIG. 5D. In the state of FIG. 5D, it should be noted that the exposed upper major surfaces of the semiconductor chips $32_{-1}$–$32_{-4}$ form the polished surfaces $45_{-1}$–$45_{-4}$, wherein the polished surfaces $45_{-1}$–$45_{-4}$ are formed at the identical level and define a flush, planar surface. In the state of FIG. 5D, it should further be noted that the thermally conductive blocks $33_{-1}$–$33_{-4}$ are held firmly by the resin package body 34. Thus, the polishing of the thermally conductive blocks $33_{-1}$–$33_{-4}$ is achieved without difficulty.

Figure 5E:
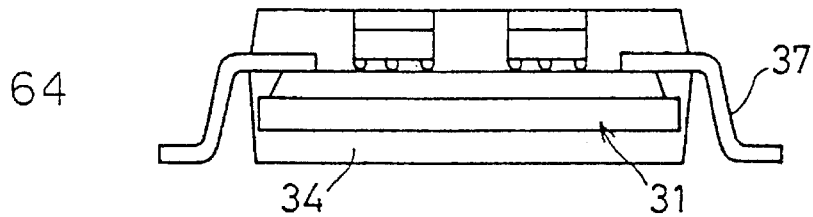
Figure 5F:
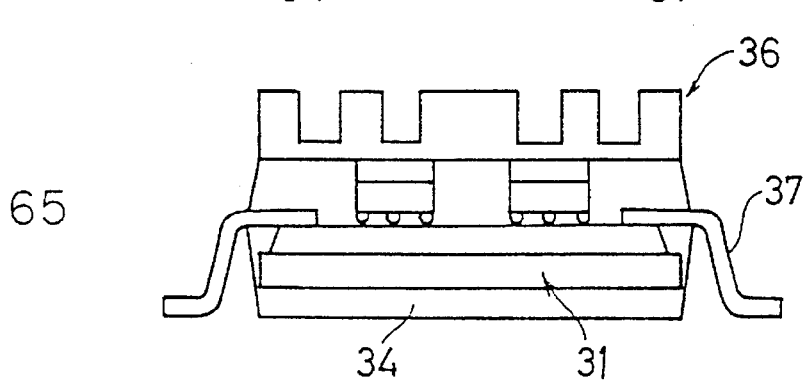

After the step 63, a step 64 of FIG. 4 is conducted wherein the leads 37 are bent as indicated in FIG. 5E, and a step 64 of FIG. 4 is conducted in which the heat sink block 36 is mounted upon the upper major surface of the resin package body 34 by the silicone adhesive. Thereby, the desired intimate contact is achieved between the heat sink block 36 and the exposed upper major surfaces $45_{-1}$–$45_{-4}$ of the thermally conductive blocks $33_{-1}$–$33_{-4}$.

Figure 6:
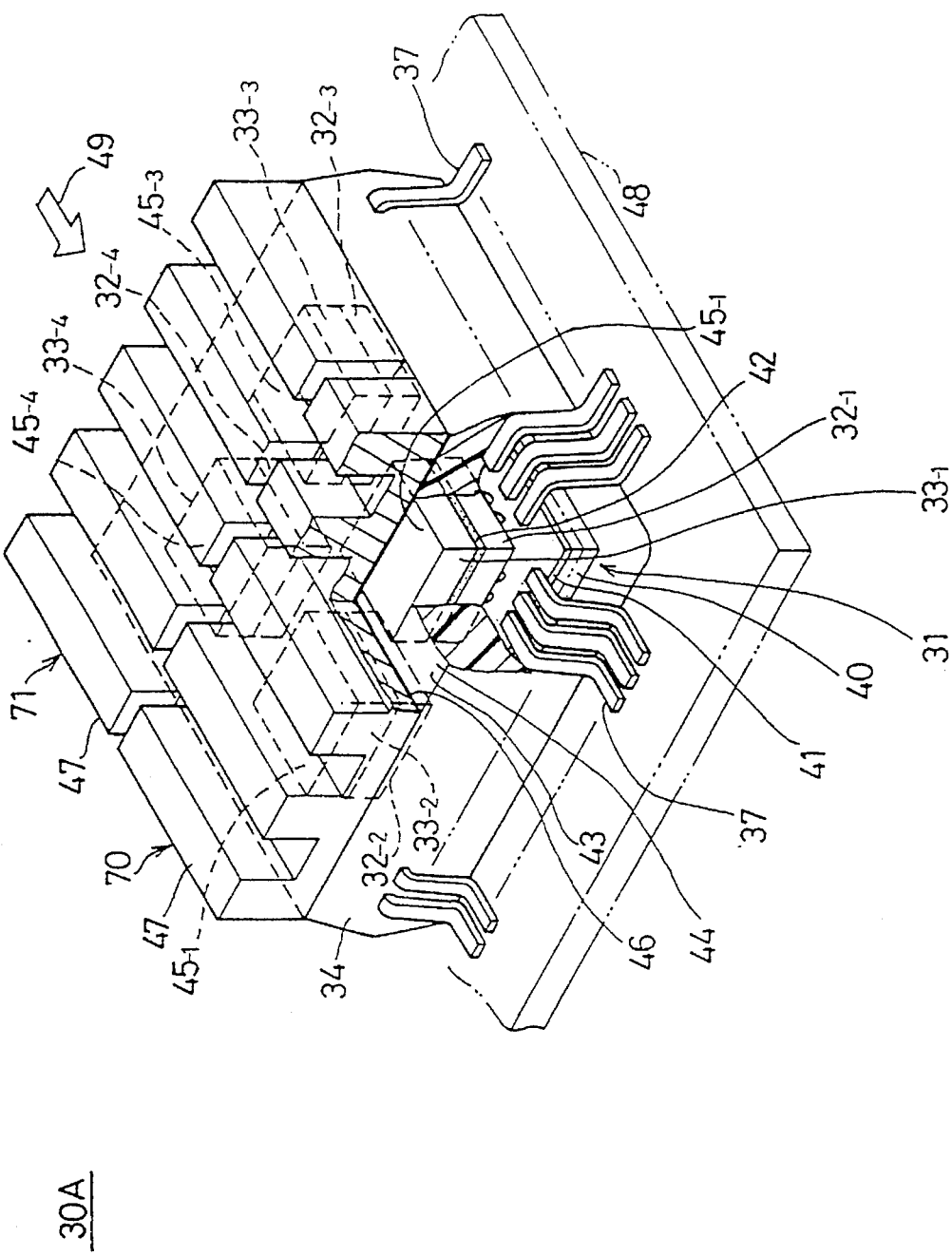
FIG. 6 is a diagram showing a multi-chip module according to a second embodiment of the present invention in a perspective view.

Next, a multi-chip module 30A according to a second embodiment of the present invention will be described with reference to FIG. 6.

In the multi-chip module 30A, the single heat sink 36 of the multi-chip module 30 is now divided into a first heat sink block 70 corresponding to the semiconductor chips $32_{-1}$ and $32_{-2}$ and a second block 71 corresponding to the semiconductor chips $32_{-3}$ and $32_{-4}$. Thus, the first heat sink block 70 achieves an intimate contact with the thermally conductive blocks $33_{-1}$ and $33_{-2}$ on the semiconductor chips $32_{-1}$ and $32_{-2}$, while the second heat sink block 71 achieves an intimate contact with the thermally conductive blocks $33_{-3}$ and $33_{-4}$ on the semiconductor chips $32_{-3}$ and $32_{-4}$. As other aspects of the multi-chip module 30A are substantially identical with the multi-chip module 30 described already, further description of the module 30A will be omitted.

Figure 7:
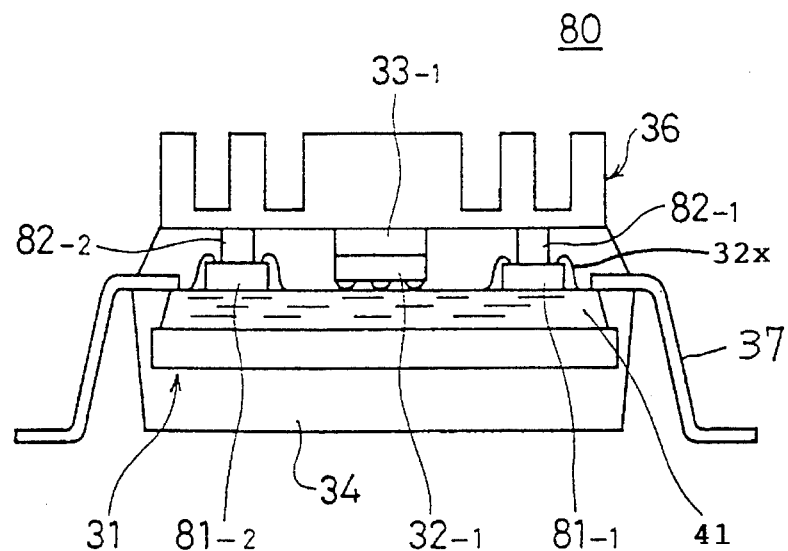
FIG. 7 is a diagram showing a multi-chip module according to a third embodiment of the present invention in a cross sectional view.

Next, a multi-chip module 80 according to a third embodiment of the present invention will be described with reference to FIG. 7. In FIG. 7, those parts described already are designated by the same reference numerals and the description thereof will be omitted.

Referring to FIG. 7, the multi-chip module 80 includes semiconductor chips $81_{-1}$ and $81_{-2}$ mounted upon the substrate 31 in the face-up state, in addition to the semiconductor chip $32_{-1}$ that is mounted in the face-down state. Thus, thermally conductive blocks $82_{-1}$ and $82_{-2}$ are mounted respectively on the semiconductor chips $81_{-1}$ and $81_{-2}$, and the chips $81_{-1}$ and $81_{-2}$ are connected electrically to the multilayer interconnection structure 41 on the substrate by means of bonding wires 32x. As other features of the present embodiment are substantially identical with those of the previous embodiments, further description of the module 80 will be omitted.

Figure 8:
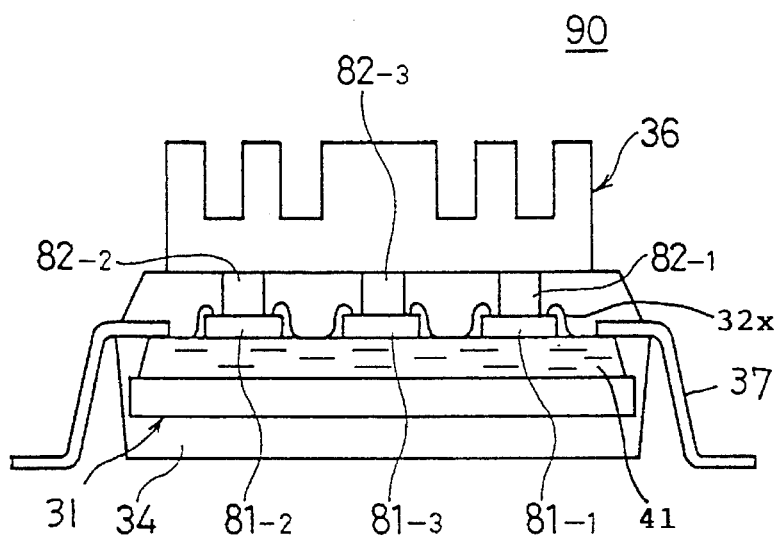
FIG. 8 is a diagram showing a multi-chip module according to a fourth embodiment of the present invention in a cross sectional view.

FIG. 8 shows a multi-chip module 90 according to a fourth embodiment of the present invention.

Referring to FIG. 8, it will be noted that the multi-chip module 90 has a construction similarly to the module 80 of FIG. 7 except the module 90 includes semiconductor chips $80_{-1}$–$80_{-4}$ all mounted in the face-up state. Other aspects of the present embodiment are substantially identical with those of the previous embodiments, further description of the module 90 will be omitted.

Figure 9:
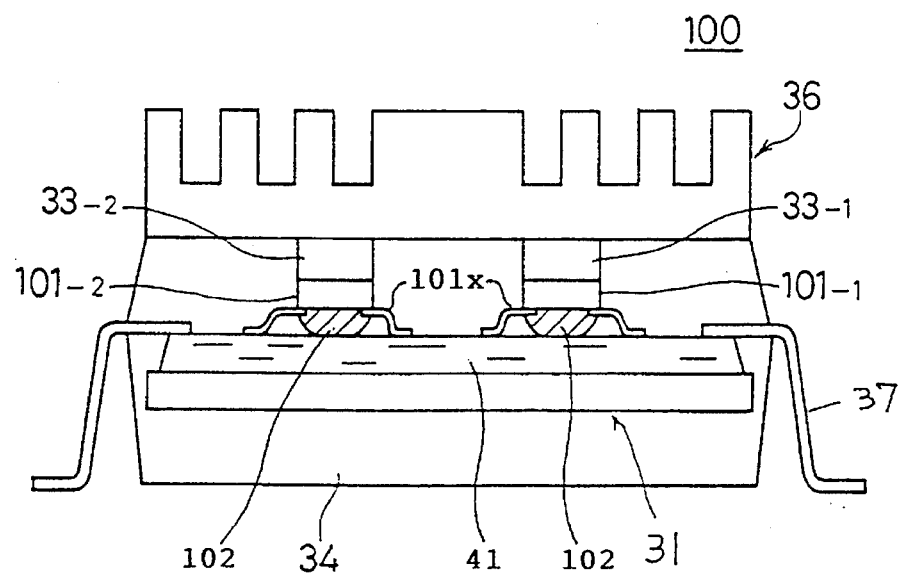
FIG. 9 is a diagram showing a multi-chip module according to a fifth embodiment of the present invention in a cross sectional view.

FIG. 9 shows a multi-chip module 100 according to a fifth embodiment of the present invention.

Referring to FIG. 9, the multi-chip module 100 includes semiconductor chips $101_{-1}$, $101_{-2}$, ..., all mounted upon the multilayer interconnection structure 41 in the face-down state by the TAB (tape automatic bonding) process. More specifically, the semiconductor chips $101_{-1}$, $101_{-2}$, ... are mounted upon a tape carrier 101x carrying thereon lead patterns, and the chips thus mounted upon the tape carrier are fixed upon the surface of the interconnection structure 41 by an adhesive 102. It should be noted that the lead patterns on the tape carrier 101x extend beyond the edge of the tape carrier and connected to the corresponding terminals on the interconnection structure 41.

Figure 10:
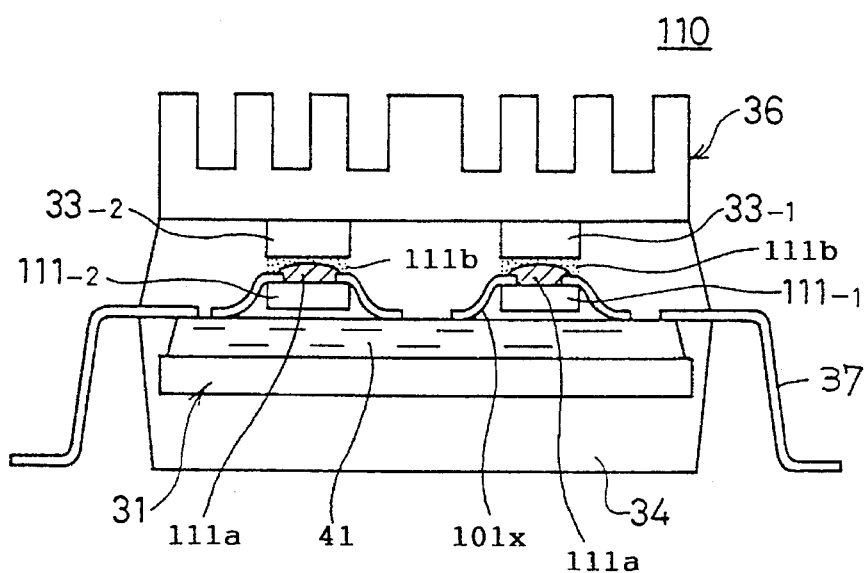
FIG. 10 is a diagram showing a multi-chip module according to a sixth embodiment of the present invention in a cross sectional view.

FIG. 10 shows a multi-chip module 110 according to a sixth embodiment of the present invention.

Referring to FIG. 10, the multi-chip module 110 includes semiconductor chips $111_{-1}$, $111_{-2}$, ..., all mounted upon the multilayer interconnection structure 41 in the face-up state by the TAB process. More specifically, the semiconductor chips $111_{-1}$, $111_{-2}$, ..., each carrying thereon the tape carrier 101x, is mounted upon the upper major surface of the multilayer interconnection structure 41 by an adhesive not illustrated, such that the conductor patterns provided on the tape carrier 101x are connected to corresponding patterns on the terminal pads on interconnection structure 41. Further, the upper major surface of the semiconductor chips $111_{-1}$, $111_{-2}$ on which the interconnection pads are provided and protected by a resin film 111a, and the thermally conductive blocks $33_{-1}$ and $33_{-2}$ are mounted upon the corresponding chips by a silver paste 111b. In this embodiment, too, the resin package body 34 including the thermally conductive blocks $33_{-1}$ and $33_{-2}$ are subjected to a polishing process for exposing blocks $33_{-1}$ and $33_{-2}$, and the heat sink 36 is mounted upon such an exposed upper major surface of the blocks $33_{-1}$ and $33_{-2}$.

Figure 11:
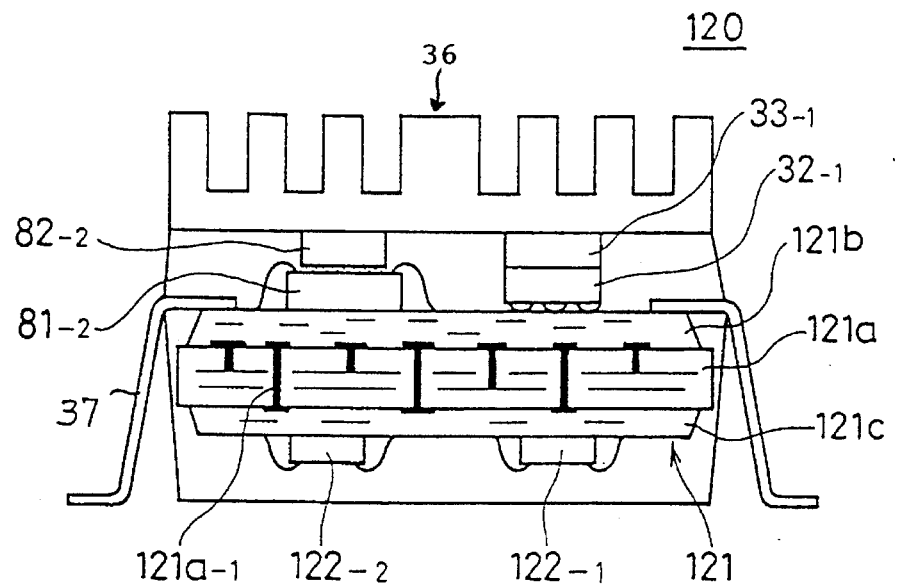
FIG. 11 is a diagram showing a multi-chip module according to a seventh embodiment of the present invention in a cross sectional view.

FIG. 11 shows a multi-chip module 120 according to a seventh embodiment of the present invention, wherein it will be noted that the multi-chip module 120 of the present embodiment is a modification of the multi-chip module 80 of FIG. 7.

Referring to FIG. 11, the multi-chip module 120 includes a ceramic substrate 121a carrying a multilayer interconnection structure 121b on an upper major surface thereof in correspondence to the multilayer interconnection structure 41 of the previous embodiments for carrying semiconductor chips $32_{-1}$ or $81_{-2}$, wherein there is provided another similar multilayer interconnection structure 121c on the lower major surface of the substrate 121a. Further, semiconductor chips $122_{-1}$, $122_{-2}$, ... are mounted upon a lower major surface of the interconnection structure 121c in electrical connection with interconnection patterns in the interconnection structure 121c by way of bonding wires. Further, in order to facilitate the heat dissipation from the semiconductor chips $122_{-1}$, $122_{-2}$, ..., there are provided a number of thermal via holes $121a_{-1}$, ... in the substrate 121a such that the thermal via holes $121a_{-1}$ are filled by thin metal wires such as a steel wire. Thereby, the heat in the semiconductor chips $122_{-1}$, $122_{-2}$, ... are transported efficiently to the upper side of the substrate 121a through the thermal via holes $121a_{-1}$, and are dissipated from the heat sink 36 after flowing along the path that includes the semiconductor chip $32_{-1}$ or $81_{-2}$ and the corresponding thermally conductive block $33_{-1}$ or $82_{-2}$. Preferably, low power semiconductor chips are used for the semiconductor chips $122_{-1}$ or $122_{-2}$ provided at the lower side of the substrate 121a.

Figure 12:
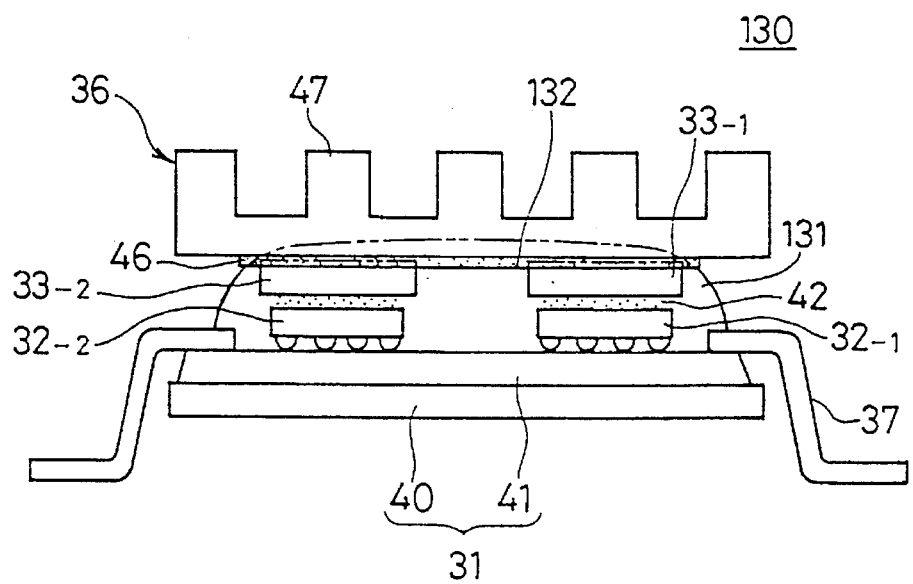
FIG. 12 is a diagram showing a multi-chip module according to an eighth embodiment of the present invention in a cross sectional view.

FIG. 12 shows the construction of a multi-chip module 130 according to an eighth embodiment of the present invention, wherein the multi-chip module 130 has a structure similar to the multi-chip module 30 of the first embodiment, except that a resin package body 131 formed of a potting process is employed in place of the resin package body 34 formed of the transfer molding process. The resin package body 131 is formed on the multilayer interconnection structure such that the thermally conductive blocks $33_{-1}$ and $33_{-2}$ are covered, followed by a polishing process applied to the upper major surface of the package body 131 thus formed so as to expose the thermally conductive blocks $33_{-1}$ and $33_{-2}$. Further, the heat sink block 36 is mounted upon the upper major surface of the resin package body 131 thus formed.

Figure 13:
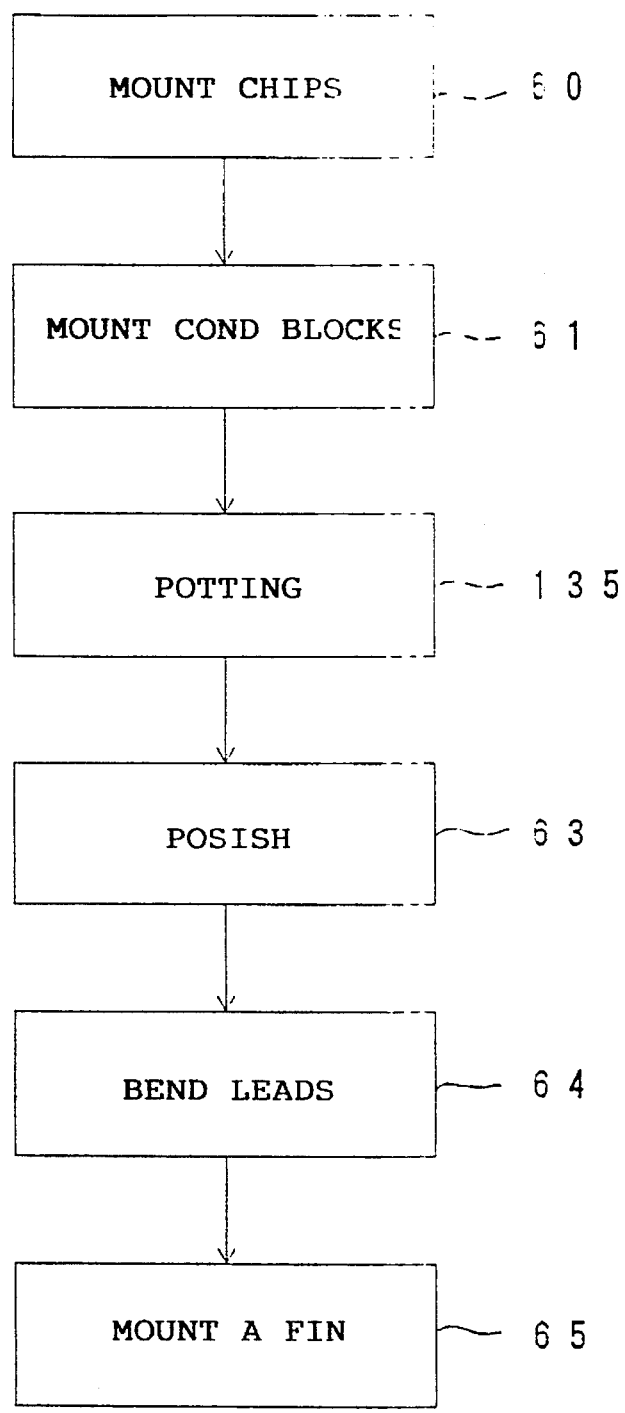
FIG. 13 is a flowchart showing the fabrication process of the multi-chip module of FIG. 12.

FIG. 13 shows the process for fabricating the multi-chip module 130 of FIG. 12, wherein the steps 60, 61, 63, 64 and 65 are substantially identical with the corresponding steps described with reference to FIG. 4, while a potting step 135 is employed between the steps 61 and 63 in place of the transfer molding process 62.

Figure 14:
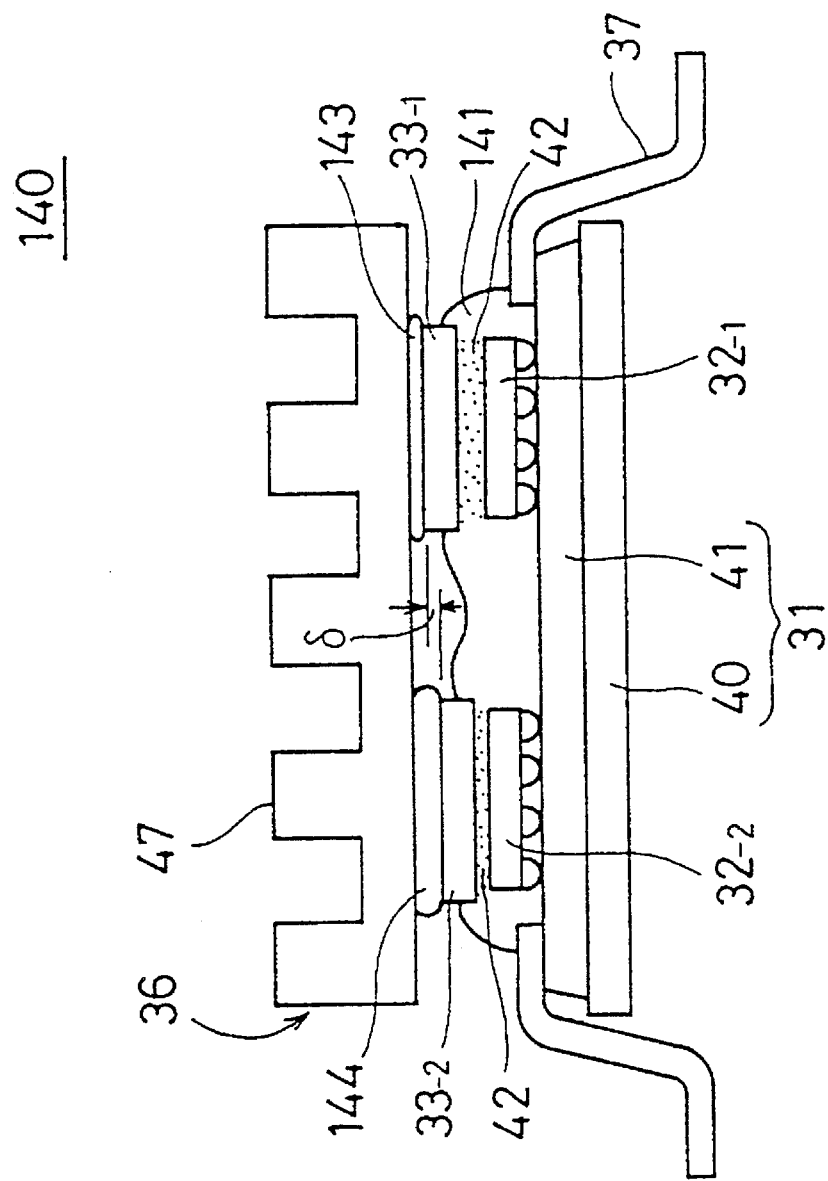
FIG. 14 is a diagram showing a multi-chip module according to a ninth embodiment of the present invention in a cross sectional view.

FIG. 14 shows a multi-chip module 140 according to a ninth embodiment of the present invention.

Referring to FIG. 14, the multi-chip module 140 has a structure similar to the device of FIG. 12 except that a resin package body 141 formed also by the potting process is used in place of the resin package body 131, wherein the resin package body 131 is formed such that the thermally conductive blocks $33_{-1}$ and $33_{-2}$ are exposed in the as-formed state of the resin package body 140. In order to eliminate the different δ for the height between the upper major surface of the block $33_{-1}$ and the upper major surface of the block $33_{-2}$, the multi-chip module 140 employs relatively thick solder layers 143 and 144 respectively on the blocks $33_{-1}$ and $33_{-2}$ such that the solder layers 143 and 144 cause a deformation and absorb any difference in the step height δ upon the mounting of the heat sink block 36.

Further, the present invention is not limited to the embodiments described heretofore, but various variations and modifications may be made without departing from the scope of the invention.

What is claimed is:

1. A multi-chip module comprising:

a substrate having upper and lower major surfaces;

an interconnection pattern provided on said upper major surface of said substrate;

a plurality of semiconductor chips provided commonly upon said upper major surface of said substrate in electrical connection with said interconnection pattern;

a plurality of thermally conductive blocks each provided on corresponding one of said plurality of semiconductor chips in an intimate contact therewith;

a resin package body that encapsulates therein said plurality of semiconductor chips and said plurality of thermally conductive blocks together with said substrate;

said plurality of thermally conductive blocks having respective upper major surfaces at a level such that said upper major surfaces of said thermally conductive blocks form a substantially flush, planar surface with an upper major surface of said resin package body, said upper major surfaces of said thermally conductive blocks being thereby exposed at said upper major surface of said resin package body;

a plurality of leads projecting from said resin package body, each of said plurality of leads being connected electrically to said interconnection pattern on said substrate; and a heat sink mounted upon said upper major surface of said resin package body such that said heat sink establishes an intimate contact with respective upper major surfaces of said thermally conducting blocks.

2. A multi-chip module as claimed in claim 1, wherein said resin package body covers both said upper and lower major surfaces of said substrate.

3. A multi-chip module as claimed in claim 1, wherein said resin package body is provided on said upper major surface of said substrate.

4. A multi-chip module as claimed in claim 1, wherein said heat sink is mounted upon said upper major surface of said resin package body by way of a silicone adhesive.

5. A multi-chip module as claimed in claim 1, wherein said multi-chip module includes a solder layer, in correspondence to each of said semiconductor chips, such that said solder layer is interposed between an upper major surface of said semiconductor chip and said thermally conducting block thereon.

* * * * *